United States Patent [19]

Erhard

[11] Patent Number: 4,615,248
[45] Date of Patent: Oct. 7, 1986

[54] MACHINE FOR SAWING THE CONTOURS OF PLATE MATERIAL

[75] Inventor: Raymond Erhard, Willer-sur-Thur, France

[73] Assignee: Smid, S.A., Lutterbach, France

[21] Appl. No.: 700,507

[22] Filed: Feb. 11, 1985

[30] Foreign Application Priority Data

Feb. 17, 1984 [FR] France ................. 84 02636

[51] Int. Cl.$^4$ .............................. B23D 47/04
[52] U.S. Cl. ...................... 83/165; 83/267; 83/411 R
[58] Field of Search .............. 83/267, 411 R, 733, 83/36, 165

[56] References Cited

U.S. PATENT DOCUMENTS

| 336,304 | 2/1886 | Ellis | 83/267 X |
| 1,334,364 | 3/1920 | Fox | 83/267 X |
| 3,186,276 | 6/1965 | Thomas et al. | 83/267 X |
| 3,592,095 | 7/1971 | Passa et al. | 83/267 |
| 4,244,253 | 1/1981 | Flanigan | 83/733 X |
| 4,361,062 | 11/1982 | Reiff | 83/36 X |

Primary Examiner—Frank T. Yost
Attorney, Agent, or Firm—Robert E. Burns; Emmaneul J. Lobato; Bruce L. Adams

[57] ABSTRACT

This machine for sawing commercial products consisting of accurately sized plates of metal, wood, chipboard or other similar materials comprises a turn-table mounted on a feed table adapted to be set in various positions along a path disposed at right angles to the sawing line, and responsive to means for driving the feed table forwards and backwards, the backward movement of the feed table being attended automatically by a 90-degree rotation of the turn-table. The invention is applicable more particularly to the trimming and finishing of the contours of multilayer printed circuits subsequent to the strata-forming operation.

10 Claims, 5 Drawing Figures

MACHINE FOR SAWING THE CONTOURS OF PLATE MATERIAL

BACKGROUND OF THE INVENTION

1. Field of the Invention

The present invention relates to sawing machines and has specific reference to a machine for sawing commercial products in the form of plates consisting of metal, wood, chipboard or other similar materials.

Various products of metal, wood, chipboard or other similar materials require, at the end of their manufacturing process, a complementary operation for obtaining accurate longitudinal and transverse dimensions before their commercialization. For this purpose, the plate contours must be sawn. In most cases this sizing operation must be carried out very accurately, notably when the plates are intended for use in the manufacture of printed circuits.

Various means have already been proposed for sizing plates of this type.

2. The Prior Art

A known arrangement for sizing plates comprises two sawing machines, i.e. one machine for cutting the plate longitudinally in order to obtain the requisite width, and another machine for cutting the plate transversely in order to obtain the proper plate length. Disposed between these two sawing machines is a transfer table adapted to move the plate in a direction across the preceding one. After positioning the plates on a feed table, the plates are presented with one of their longitudinal edges facing the saw blade of the first machine. After the cutting step, the plates are shifted to present their other longitudinal edge in front of the same machine for cutting the plates to the desired width. Then, the plates are moved to a transfer table which causes the plates to present their transverse edges in succession to the saw blade of the second machine. After obtaining the desired length, the plates are removed from the machine assembly. The major inconvenience characterizing this system lies in its complexity. In fact, the machines are loaded and unloaded at two different places, thus requiring several operators for handling the plates.

Another known device comprises a single sawing machine permitting of sawing the plates from beneath. Firstly, the two longitudinal edges are cut to obtain the predetermined plate width, whereafter the plate is rotated manually through one-fourth of a revolution for cutting the two transverse edges to obtain the desired plate length. The chief inconvenience of this system is that the plates must be handled manually.

Another known arrangement comprises a gantry-type machine adapted to saw the plates from above. Various gantry-sawing machines are available which comprise either a cross-motion swivel-head movable beam or a pair of parallel moving beams, or alternately two twin-beams transfer machines with one beam for cutting the plates longitudinally and another beam for cutting the plates transversely. Since the plate surface area is variable, the position of the cutting line is not always the same and varies as a function of the magnitude of said area. Thus, it is difficult in a gantry machine of this type to provide means for automatically removing scraps. Therefore, scraps must be removed manually.

SUMMARY OF THE INVENTION

It is the primary object of the present invention to provide a machine for sawing the contours of plate materials which is characterized in that it permits of eliminating the manual handling of the plates which are sawed from beneath, the scraps being removed by automatic means.

For this purpose, the present invention provides a machine for sawing commercial products in the form of plates of metal, wood, chipboard or other similar materials, which are machined to the desired dimensions by sawing from beneath, this machine being characterized by the fact that it comprises a turn-table mounted on a feed table adapted to be positioned in a direction at right angles to the sawing line and to travel both in the feed direction and in the backward direction, this backward movement causing automatically the rotation of the turn-table through one-fourth of a revolution.

The advantages resulting from this invention lie essentially in the fact that the machine is a unitary, single saw-blade machine of relatively reduced over-all dimensions, and adapted to be loaded and unloaded at a same station. Therefore, the machine can be controlled by a single operator. Moreover, this sawing machine affords a high degree of precision since the table positioning for both longitudinal and transverse cutting operations is constantly of the positive abutment type with respect to a same and single saw-blade. Since the saw-cut is constantly in the same position, it is possible to provide simple means for removing scraps automatically.

The invention will be better understood from the following description of a typical form of embodiment thereof, described hereinafter way of example with reference to the accompanying drawings.

THE DRAWINGS

DESCRIPTION OF THE PREFERRED EMBODIMENT

Figure 1:
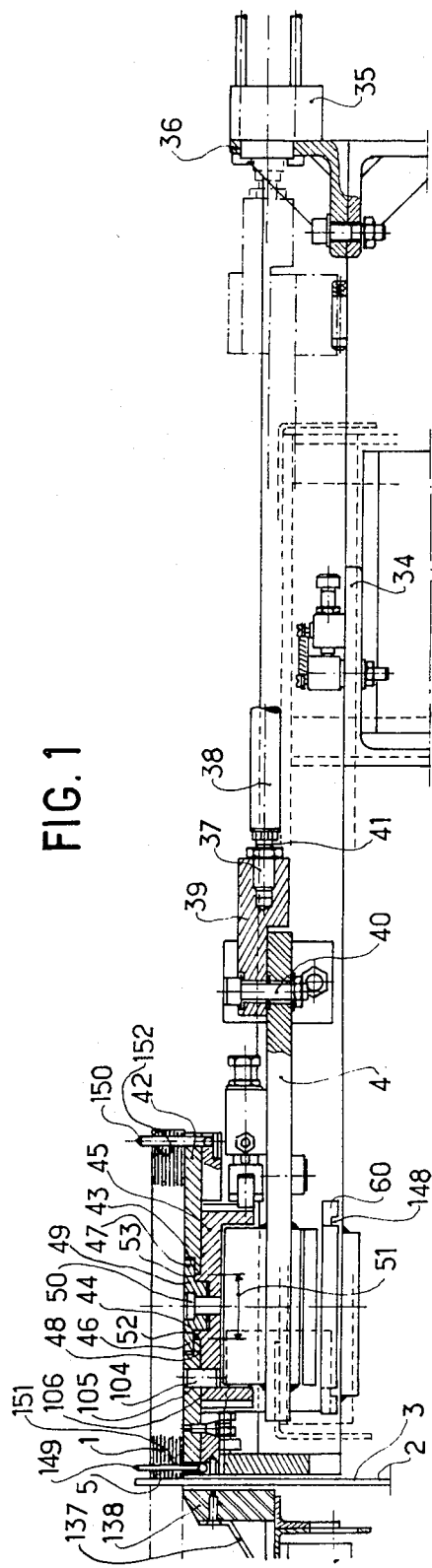
FIG. 1 is a front elevational, part-sectional view showing the turn-table and linear-translation feed table assembly mounted on a sawing machine according to the present invention.
Figure 2:
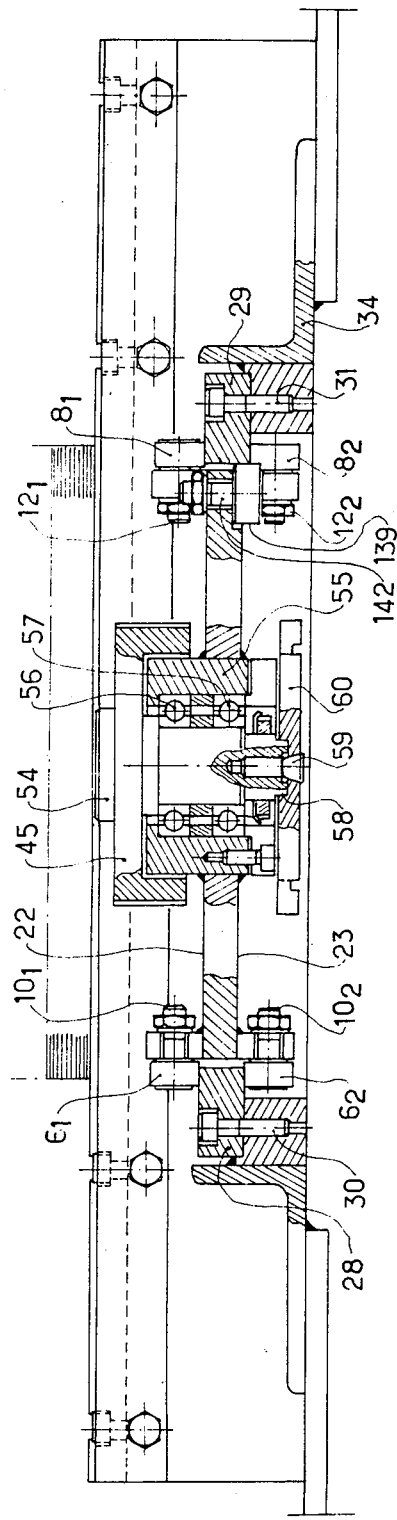
FIG. 2 is a section taken on a larger scale along the broken line II—II of FIG. 5.
Figures 3, 4, 5:
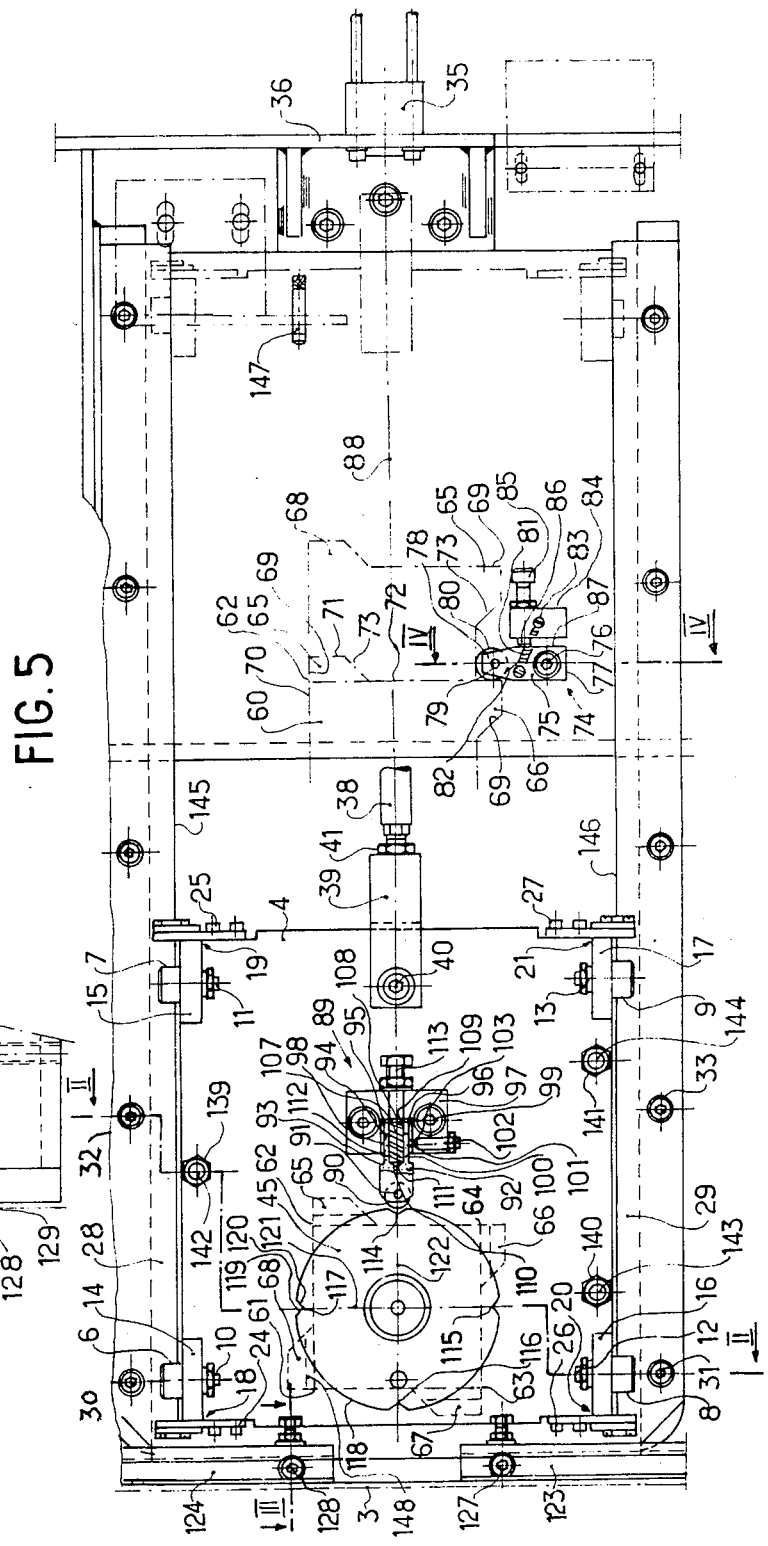
FIG. 3 is a fragmentary section taken also on a larger scale along the line III—III of FIG. 5.
FIG. 4 is a fragmentary section taken on a larger scale along the line IV—IV of FIG. 5.
FIG. 5 is a plan view from above of the turn-table and linear-translation feed table assembly.

Referring first to FIGS. 1, 2 and 5 of the drawings, the machine for sawing the four sides of plates 1 intended notably but not exclusively for the fabrication of printed circuits comprises a circular sawblade 2 mounted for sawing the plates 1 from beneath. The plates 1, which are stacked, are moved toward the sawing line 3 by a feed table 4. This feed table 4 is adapted to be reciprocated in a direction at right angles to the sawing line 3 to present the stacked plates 1 to the circular saw blade 2 for cutting the edge 5 and subsequently retract this stack of plates 1 at the end of the sawing step.

For this purpose, the feed table 4 comprises sets of rollers 6, 7, 8, 9 comprising upper rollers $6_1, 7_1 \ldots$ and lower rollers $6_2, 7_2 \ldots$. These rollers $6_1, 7_1 \ldots, 6_2, 7_2$ ... are rotatably mounted on horizontal shafts 10, 11, 12, 13, 10$_1$, 11$_1$ ... in supports 14, 15, 16, 17 disposed preferably at the four corners 18, 19, 20, 21 of feed table 4. These supports 14, 15, 16, 17 protruding both from the top surface 22 and from the bottom surface 23 of feed table 4 are secured to this feed table 4 by welding. Furthermore, these supports 14, 15, 16, 17 are provided with scrapers 24, 25, 26, 27. The sets of rollers 6, 7, 8, 9 are guided by rails 28, 29 secured by fastening members 30, 31, 32, 33 ... to a fixed frame structure 34. The rails 28, 29 are disposed between the upper rollers 6$_1$, 7$_1$ ... and the lower rollers 6$_2$, 7$_2$ ... .

On the other hand, the feed table 4 is guided laterally by another set of rollers 139, 140, 141 rotatably mounted on vertical shafts 142, 143, 144 and engaging the side edges 145, 146 of rails 28, 29, as shown.

The feed table 4 of the sawing machine is reciprocated by means of a preferably hydraulic fluid-operated cylinder 35 rigid with a supporting plate 36 secured in turn to the fixed frame structure 34. The outer end 37 of the piston 38 of this fluid-operated cylinder 35 is rigidly connected to one end of a link 39 having its opposite end coupled through a fastening member 40 to the feed table 4. The stroke of feed table 4 is adjustable on the one hand by means of cylinder 35 and on the other hand by means of adjustment means 41 of known type permitting of modifying at will the position of the end 37 of the piston 38 of cylinder 35 in relation to said link 39.

According to the instant invention, the feed table 4 comprises a turn-table 42 on which the plates 1 are stacked. To fix the turn-table 42, locking means are provided which permit the interchangeability of turn-table 42. For this purpose, a cross-shaped recess 43 is formed centrally of turn-table 42. A lock-pawl 44 is disposed in this recess 43 for fixing the turn-table 42 to the top of a rotary flange 45. When the lock-pawl 44 is in the position shown in FIG. 1, both wings 46, 47 of this pawl bear on shoulders 48, 49 of recess 43 and the turn-table 42 cannot be removed from the machine by pulling this turn-table upwards. On the other hand, when the lock-pawl 44 is rotated through one-fourth of a revolution about a pivot pin 50 the locking action produced between said wings 46, 47 of lock-pawl 44 and shoulders 48, 49 of recess 43 of turn-table 42 is inhibited and the turn-table 42 can be removed. Therefore, several turn-tables 42 may be provided for adapting the proper turn-table 42 to the size of plates 1. The width of lock-pawl 44 is less than the distance 51 between the edges 52, 53 of shoulders 48, 49.

The turn-table 42 can rotate due to the provision of an arbor 54 rotatably rigid with said flange 45 and adapted to revolve in a bearing case 55 provided with ball-bearings 56, 57 and rigidly secured to said feed table 4.

During the backward movement of feed table 4, the turn-table 42 is driven automatically due to the provision of a control device comprising, on the lower end 58 of arbor 54, means 59 for fixing an indexing cam 60. This indexing cam 60 has a square-shaped surface and comprises at its four corners 61, 62, 63, 64 stop members 65, 66, 67, 68. Each stop member 65, 66, 67, 68 has substantially the shape of a rectangular trapezium of which the small side 69 constitutes an extension of one of the sides 70 of each corner 61, 62, 63, 64 of indexing cam 60, another side 71 of this trapezium, which is perpendicular to said small side 70, being connected through an inclined ramp 73 to the other side of corner 61, 62, 63, 64.

Stop members 65, 66, 67, 68 are adapted to cooperate successively with an indexing device 74 illustrated in FIGS. 1, 4 and 5. This indexing device 74 comprises essentially a lever arm 75 adapted to pivot in a horizontal plane about a vertical fulcrum pin 76 rigid with the fixed frame structure 34. This vertical fulcrum pin 76 is disposed at one end 77 of lever arm 75 of which the opposite end 78 carries a vertical pivot pin 79 for rotatably mounting a roller 80 cooperating with the indexing cam 60. The roller 80 is urged resiliently against the indexing cam 60 by a tension spring 81 having one end 82 attached to lever arm 75 and the other end 83 anchored to a bracket 84 fastened to said frame structure 34. An adjustable member 85 extends through bracket 84 and has its operative end 86 urged resiliently against a side wall or edge 87 of lever arm 75 due to the elastic force of tension spring 81. This adjustable member 85 prevents the retraction of roller 80 during the backward movements of feed table 4. Thus, the roller holds the lever arm 75 in its operative position. The combined action of indexing cam 60 and indexing device 74 is attended by the rotation of turn-table 42 through one-fourth of a revolution or 90 degrees, as follows:

During the backward movement of feed table 4, the small side 69 of stop member 66 strikes the roller 80 of lever arm 75. This lever arm 75 cannot pivot backwards due to the engagement of its side face 87 with adjustable member 85. Thus, a clockwise rotational movement is impressed to the indexing cam 60. The small side 69 of stop member 66 and subsequently the side 72 of corner 62 are caused to slide along the roller 80 until said side 72 is parallel to the median plane 88 of feed table 4, so that the adjacent stop member 65 is caused to register with the indexing device 74. During the feed stroke of feed table 4 the inclined ramp 73 of stop member 65 engages roller 80, and this roller 80 is caused to retract and consequently the lever arm 75 pivots about its vertical fulcrum pin 76 until the roller 80 slides on the small side 69 of stop member 65. During the rotation of lever arm 75 a tractive effort is exerted on tension spring 81. Thus, when stop member 65 is disengaged from roller 80 this tension spring 81 will move the lever arm 75 back to its operative position.

However, during the feed movement the turn-table 42 must necessarily be held against movement and cannot pivot. For this purpose, a locking device 89 is provided for on the one hand holding the turn-table 42 in the proper angular position in relation to the median plane 88 and on the other hand holding the turn-table 42 in the proper position during the feed movement of feed table 4.

This locking device 89 secured to the feed table 4 comprises a roller 90 rotatably mounted on a pivot pin 91 held in a slider 92 provided at its rear portion 93 with a cylindrical body 94. This cylindrical body 94 is slidably mounted in a socket 95 fitted in a horizontal housing 96 formed in a bracket 97 secured by fastening members 98, 99 to the top surface 22 of feed table 4. To prevent the rotation of said cylindrical body 94 in socket 95, a longitudinal groove 100 is formed in the cylindrical body 94 and engaged by the end 101 of a stud 102 extending through a transverse bore 103 formed in said socket 95. The bracket 97 encloses a resilient member in the form of a coil compression spring 107 permitting the movements of slider 92 and resiliently holding the operative engagement between the roller 90 and the peripheral contour of flange 45 rigidly coupled to turn-table 42 for rotation therewith by means of pivot pin 50 and also by means of a coupling pin 104 engaging on the one hand a hole 105 formed through said turn-table 42 and on the other hand a hole 106 formed through said flange 45 (see FIG. 1). One end 108 of spring 107 bears against the bottom 109 of housing 96 and reacts with its other end 110 against the bottom 111 of a blind hole 112 formed in said cylindrical body 94. The compressive force of spring 107 can be modified as required by means of an adjustment member 113, consisting in this example of a screw and lock-nut assembly.

The roller 90 engages V-shaped notches 114, 115, 116, 117 formed in the peripheral contour 118 of flange 45. The two wings 119, 120 of each V-shaped notch 114, 115, 116, 117 are disposed by pairs on two diameters 121, 122 disposed at right angles to each other. The roller 90 engages simultaneously the two wings 119, 120 of each notch 114, 115, 116, 117, thus locking the flange 45 in the corresponding angular position. During the rotation of turn-table 42 the roller 90 slides along the contour 118 of flange 45 while compressing the spring 107 of locking device 89. When the roller 90 registers with one of said notches 114, 115, 116, 117 the compression spring 107 is allowed to expand and urges the roller 90 into the registering notch until is engages both wings 119, 120 thereof. Thus, the turn-table 42 is held in the corresponding angular position.

Since the dimensions of plates 1 must be very accurate, notably if these plates 1 are intended for the fabrication of printed circuits, it is necessary to position very accurately the assembly comprising the feed table 4 and the turn-table 42 in relation to the sawing line 3. For this purpose, precision stop members 123, 124 engageable by the edge 125 of turn-table 42 are provided (see FIGS. 1, 3 and 5). These precision stop members 123, 124 comprise each a horizontal strip 126 provided with vertical holes for receiving fastening members or screws 127, 128 therethrough which engage corresponding tapped holes formed in a support 129 rigid with the fixed frame structure 34. The head 130 of fastening members 127, 128 is countersunk in a recess 131 formed vertically in the horizontal strip 126. This recess 131 leads to a bore 132 having a diameter greater than that of said fastening members 127, 128. The precision stop members 123, 124 also comprise a vertical wing 133 through which adjustment members 134 extend horizontally. The front ends 135 of said adjustment members 134 bear against the rear face 136 of support 129. When actuating said adjustment members 132 the precision stop members 123, 124 are moved horizontally, i.e. at right angles to the sawing line 3. After adjusting the position of the precision stop members 123, 124, the fastening members 127, 128 are locked. Thus, the adjustment of the operative stroke of feed table 4 is completed by means of the precision stop members 123, 124.

Since the sawing line 3 remains constantly in the same position, the sawing machine may be provided with a device for removing scraps automatically. This device as shown in FIG. 1 comprises an inclined ramp 137 rigid with a support 138 disposed on the other side of the sawing line with respect to the feed table 4. The scraps fall upon the inclined ramp 137 and are subsequently directed towards any suitable discharge or disposal means (not shown).

It is possible that, as a consequence of an excessive acceleration or deceleration of the feed table 4, the turn-table 42 be caused to make undesired pivotal movements. For this purpose, a safety device comprising an emitter photocell 147 mounted to the feed table 4 and a receiver photocell (not shown) secured to the frame structure is provided according to the present invention. The emitter photocell 147 emits a light ray through a slit 148 formed in each side of the indexing cam 60. This slit 148 is exactly parallel to the median plane 88. Thus, when the turn-table 42 is not properly positioned, the light ray cannot pass through the slit 148 and the receiver photocell is not energized, and reacts by stopping the feed movement of feed table 4.

When stacking the plates 1, these must be positioned accurately in relation to the turn-table 42. This turn-table comprises for this purpose centering studs 149, 150 on which the plates 1, provided in a manner well known per se with positioning holes 151, 152, are threaded.

Though the present invention has been described with reference to a specific form of embodiment, it will readily occur to those conversant with the art that various modifications may be brought to the shapes, materials and combinations of means disclosed and shown herein, without departing however from the basic principles of the invention as set forth in the appended claims.

What is claimed as new is:

1. A machine for sawing commercial products in the form of plates of metal, wood, chipboard or other similar materials to accurate sizes comprising a frame structure, a saw mounted on said frame structure for cutting said products from underneath along a predetermined saw line, rails on said frame structure extending perpendicular to said saw line, a feed table having a set of lower rollers and a set of upper rollers rotatable about horizontal pivot pins and rolling on said rails for movement of said feed table toward and away from said saw line, said rails being disposed between upper and lower rollers, means for moving said feed table toward and away from said saw line at right angles thereto, said moving means comprising a hydraulic cylinder secured to said frame structure and a piston reciprocable in said cylinder and having a piston rod coupled to one end of a connecting link, the other end of which is connected with said feed table, said link comprising means for changing the position of said feed table to said piston rod, a turn-table rotatable mounted on said feed table and adapted to hold the products to be sawed, means on said turn-table for accurately positioning said products relative to said turn-table, means for automatically rotating said turn-table one-fourth of a revolution during backward movement of said feed table away from said saw line and means for precisely positioning said turn-table in selected angular position during forward movement of said feed table.

2. A sawing machine according to claim 1, in which said means for rotating said turn-table one-fourth of a revolution comprises a control device comprising an indexing cam rotationally rigid with said turn-table, said indexing cam having a square configuration and comprising stop members at its corners, each of said stop members having substantially the shape of a rectangular trapezium of which a small side constituting an extension of one side of the corresponding corner and the side perpendicular to said small side are inter-connected by an inclined ramp at the other side of said corner.

3. A sawing machine according to claim 2, in which said control device further comprises indexing means for actuating one of said stop members during the backward movement of said feed table, said indexing means being retracted during forward movement of said feed table, said indexing means comprising a lever arm pivotal about a vertical fulcrum pin rigid with said frame structure, a roller rotatable and retractably mounted on said lever arm and cooperating with said stop members of said indexing cam, a support rigid with said frame structure and resilient means acting between said support and said lever arm to exert a tractive resilient force on said lever arm for urging said lever arm to an operative position, said support comprising an adjustable member counter-acting the retraction of said roller during backward movement of said feed table, the end of said adjustable member engaging the edge of said lever arm when said lever arm is in its operative position.

4. A sawing machine according to claim 2, in which said indexing cam comprises on either side a slit strictly parallel to the median plane of said sawing machine and in which a safety device comprises an emitter photocell for emitting a light ray along said slit and a receiver photocell aligned with said emitter photocell for receiving said light ray when said indexing cam is properly aligned.

5. A sawing machine according to claim 1 in which a flange having a countoured outer periphery is rigidly coupled with said turn-table and in which said means for precisely positioning said turn-table in selected angular position during forward movement of the feed table comprises a locking device comprising a bracket rigid with a top surface of said feed table and formed with a horizontal housing, a slider having a cylindrical body slidable in said housing, a roller rotatably mounted by a pivot pin on said slider, means for preventing rotation of said cylindrical body relative to said housing, and a resilient member acting between said housing and said cylindrical body to urge said roller into engagement wih the peripheral contour of said flange.

6. A sawing machine according to claim 5, in which said flange comprises on its outer peripheral countour, several V-shaped notches disposed by pairs on two separate diameters perpendicular to each other, said notches being engageable by said roller of said locking device, said notches having two wings perpendicular to each other and adapted by cooperating simultaneously with said roller to position said turn-table and hold said turn-table accurately in the selected position.

7. A sawing machine according to claim 1, further comprising precision stop members engageable by the edges of said turn-table and fastening members for securing said precision stop members to said frame structure, each of said precision stop members comprising a horizontal strip formed with a bore of greater diameter than said fastening members and a vertical wing through which horizontal adjustment members are insertable for positioning said precision stop members relative to said fastening member and consequently relative to said sawing line.

8. A sawing machine according to claim 1, in which said turn-table is mounted on a flange rotatable on said feed table and in which a locking device permitting interchangeability of said turn-table comprises a cross-shaped recess formed in said turn-table and having a pair of shoulders, and a lock-pawl pivotally mounted on said flange and comprising two wings somewhat longer than the distance between the edges of said shoulders and wider than the distance between the edges of said shoulders.

9. A sawing machine according to claim 1, further comprising means for automatically removing scraps, said scrap removing means comprising an inclined ramp disposed on the other side of said sawing line with respect to said feed table.

10. A sawing machine accordinto claim 1, in which said means for accurately positioning said products relative to said turn-table comprises centering studs projecting up from said turn-table and received in holes in said products.

* * * * *